(12) United States Patent
Niedernostheide et al.

(10) Patent No.: US 6,727,526 B1
(45) Date of Patent: Apr. 27, 2004

(54) THYRISTOR WITH RECOVERY TIME VOLTAGE SURGE RESISTANCE

(75) Inventors: Franz Josef Niedernostheide, Muenster (DE); Hans-Joachim Schulze, Ottobrunn (DE)

(73) Assignee: Siemens Aktiengesellschaft, München (DE)

( * ) Notice: Subject to any disclaimer, the term of this patent is extended or adjusted under 35 U.S.C. 154(b) by 174 days.

(21) Appl. No.: 10/089,590
(22) PCT Filed: Sep. 26, 2000
(86) PCT No.: PCT/DE00/03351
§ 371 (c)(1), (2), (4) Date: Apr. 5, 2002
(87) PCT Pub. No.: WO01/24274
PCT Pub. Date: Apr. 5, 2001

(30) Foreign Application Priority Data

Sep. 30, 1999 (DE) .......................................... 199 47 028

(51) Int. Cl.[7] .............................................. H01L 29/74
(52) U.S. Cl. .................. 257/107; 257/111; 257/131; 257/139; 257/143; 257/144; 257/152; 257/153
(58) Field of Search ................................. 257/111, 131, 257/139, 143, 144, 152, 153

(56) References Cited

U.S. PATENT DOCUMENTS

| 4,195,306 A | 3/1980 | Fullmann et al. |
| 5,028,974 A | 7/1991 | Kitagawa et al. |
| 6,373,079 B1 * | 4/2002 | Ruff et al. .................. 257/111 |

FOREIGN PATENT DOCUMENTS

| DE | 3837747 C2 | 7/1997 |
| DE | 19650762 A1 | 7/1998 |
| EP | 0062100 | 10/1982 |
| EP | 0100136 | 2/1984 |
| EP | 0564007 A1 | 10/1993 |
| EP | 0714139 A1 | 5/1996 |
| JP | 61-202465 | 8/1886 |
| WO | PCT/DE92/00191 | 10/1992 |
| WO | PCT/DE97/02237 | 4/1998 |
| WO | PCT/DE98/00248 | 8/1998 |

OTHER PUBLICATIONS

H. Mitlehner: "High Voltage Thyristor for HVDC Transmission and Static Var Compensators", IEEE 1998.

Schulze et al.: "Light Triggered 8kV Thyristor with a New Type of Integrated Breakover Diode", PCIM 1996, Nürnberg, Germany.

P. Voss: "A Thyristor Protected Against di/dt–Failure at Breakover Turn–On", in: Solid State Electronics 1974, vol. 17, pp. 655–661.

* cited by examiner

Primary Examiner—Son L. Mai
Assistant Examiner—Mai-Huong Tran
(74) Attorney, Agent, or Firm—Henry M. Feiereisen

(57) ABSTRACT

A preferably asymetrical thyristor (1) with at least one driver stage (20) for amplifying a control current (I) fed into the cathodal base (16) of the thyristor, in which, in the driver stage, the transistor gain factors $\alpha_{npn}$ and $\alpha_{pnp}$ are in each case greater than, preferably, in the thyristor and anode short circuits of the thyristor (174) have a smaller electrical conductivity in the driver stage than in the thyristor.

9 Claims, 1 Drawing Sheet

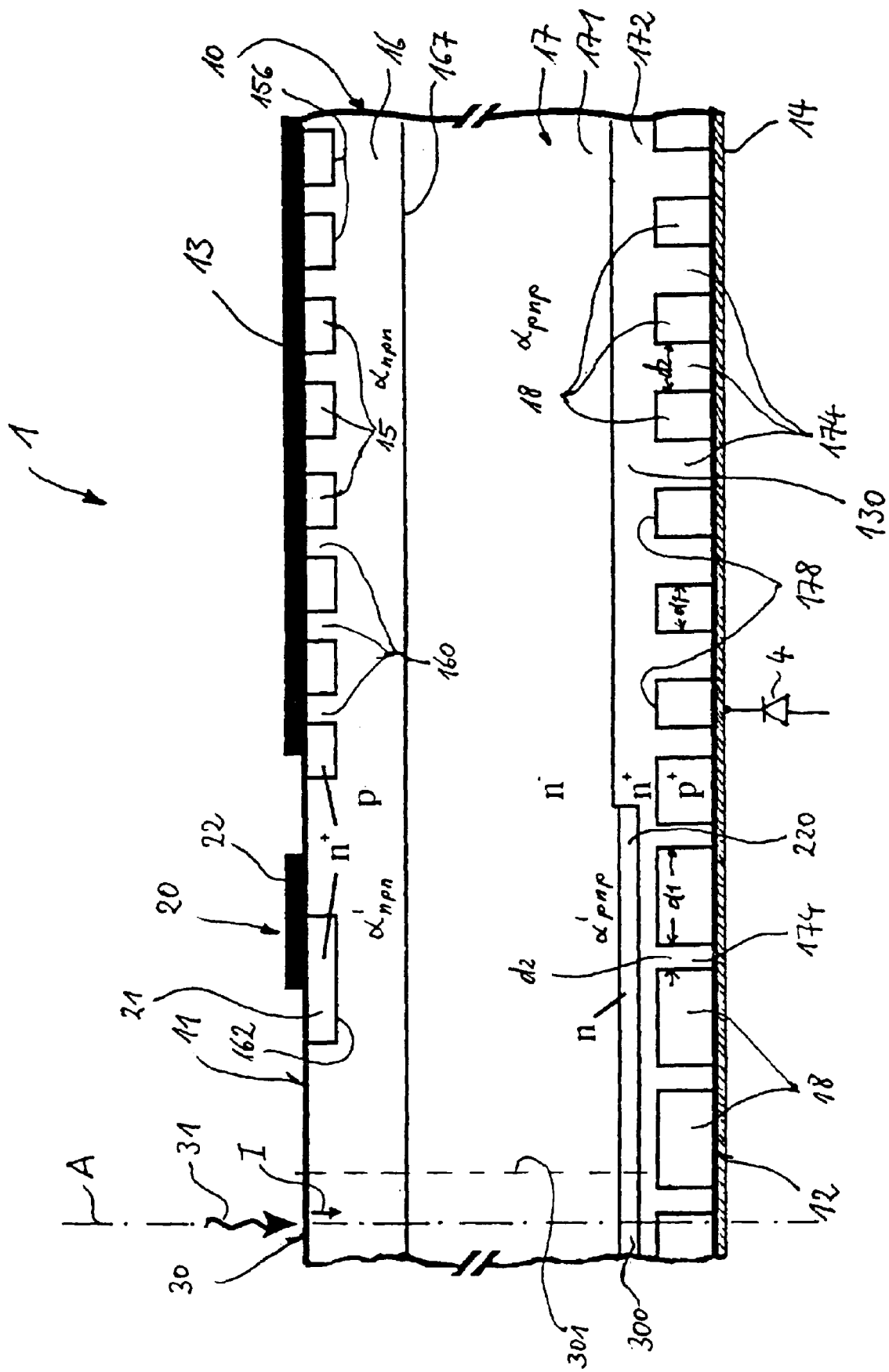

THYRISTOR WITH RECOVERY TIME VOLTAGE SURGE RESISTANCE

BACKGROUND OF THE INVENTION

The invention relates to a thyristor having the following construction; in a body made of differently doped semiconductor material which has an electrode serving as cathode and also an electrode serving as anode, there are formed

- a cathodal emitter of a first conduction type
- a cathodal base of a second conduction type,
- an anodal base of the first conduction type,
- an anodal emitter of the second conduction type and
- at least one driver stage for amplifying a control current fed into the cathodal base,
- the driver stage has a further emitter of the first conduction type, which is formed in the cathodal base and is isolated from the cathodal emitter, and also a metallization layer which makes contact both with the cathodal base and with the further emitter.

A thyristor of the aforementioned type is disclosed by H. Mitlehner, J. Sack, H.-J-Schulze: "High Voltage Thyristor for HVDC Transmission and Static VAR Compensators", Proceedings of PESC, Kyoto, 1988, S. 934, or by WO 98/34282 (97P1089). In this known thyristor, the cathodal emitter of the first conduction type is formed by an n$^+$-doped region of the wafer-type body composed of semiconductor material in the form of silicon, said region adjoining a main area of said body.

The cathodal base of the second conduction type is defined by a p-doped region of the body, which region adjoins the n$^+$-doped region and, together with this region, forms an np junction.

The anodal base of the first conduction type is defined by an n$^-$-doped region and an n$^+$-doped region of the body which adjoin one another and of which the n$^-$-doped region adjoins the p-doped region of the cathodal base and, together with this region, forms a pn junction.

The anodal emitter of the second conduction type is defined by a p$^+$-doped region of the body, which region, on the one hand, adjoins the n$^+$-doped region of the anodal base and, together with this region, forms an np junction and, on the other hand, adjoins the main area of the body which is remote from the first main area.

Cathode short circuits are formed in the cathodal emitter of the thyristor, which cathode short circuits connect the cathodal base and the cathode to one another and ensure that, even in the event of a large dU/dt loading of a few 1000 volts/μs, the thyristor does not already trigger in an uncontrolled manner before the static breakover voltage is reached.

In order to suppress the influence of a leakage current on a transistor gain factor $\alpha_{pnp}$ of the thyristor, which factor, below the cathode of the thyristor, is defined by the cathodal base, the anodal base and the anodal emitter, with a low leakage current density, a plurality of anode short circuits are formed in the anodal emitter, which anode short circuits connect the anodal base and the anode to one another.

The further emitter of the single driver stage ("amplifying gate") is defined by an n$^+$-doped region which adjoins the first main area of the body but is spatially separate from the n$^+$-doped region of the cathodal emitter and is formed in the p-doped region of the cathodal base and, together with this region, forms an np junction.

The p-doped region of the cathodal base likewise adjoins the first main area of the body laterally beside the n$^+$-doped region of the further emitter. The metallization layer is applied on this first main area and makes contact both with the p-doped region of the cathodal base and with the n$^+$-doped region of the further emitter.

Instead of only one such driver stage, there may be two or more of them present (see, for example, FIG. 5 of the first document mentioned above).

The control current fed into the p-doped region of the cathodal base is generated at a location beside the n$^+$-doped further emitter of the driver stage at which the p-doped region of the cathodal base adjoins the first main area of the body in a manner free from the metallization layer of the driver stage.

The control current can be generated with the aid of a triggering contact and/or a light-sensitive structure which are/is formed at said location at the first main area of the body.

In particular, the thyristor is formed such that it is rotationally symmetrical with regard to an axis perpendicular to the two main areas of the body. The location for feeding in the control current lies in a central partial region— surrounding the axis—of the first main area of the wafer-type body.

The driver stage is arranged radially with respect to the axis between the central partial region and the cathode of the thyristor.

Moreover, the known thyristor is an asymmetrical thyristor having a stop zone of the first conduction type which is formed by the n$^+$-doped region of the anodal base. This stop zone has the effect that the breakover triggering of the thyristor is constrained not by an avalanche breakdown (avalanche effect) but rather by the so-called "punch-through" effect, i.e. by the expansion of the space charge zone of the reverse-biased pn junction between the cathodal base and the anodal base as far as the forward-biased np junction between the anodal base and the anodal emitter in the body made of semiconductor material.

The asymmetrical thyristor disclosed in the first document mentioned above has the special feature that it is connected in series with a diode and, together with this diode, forms a tandem thyristor which is an alternative to a tandem thyristor comprising two symmetrical thyristors connected in series.

The thyristor disclosed by WO 98/34282 has the special feature that the n$^+$-doped stop zone is doped more weakly in a region lying below the central partial region than in the laterally adjoining region. This special feature has the advantage that the breakover voltage of the thyristor does not depend on the temperature or depends on the temperature only to an insignificant extent. In this case, moreover, there is the advantage that a stop zone which has a comparatively more weakly doped region besides a more highly doped region can be fabricated simply and cost-effectively, for example by means of "masked" implantation.

H.-J. Schulze, M. Ruff, B. Baur, F. Pfirsch, H. Kabza, U. Kellner, P. Voss: "Light Triggered 8 kV Thyristor with a New Type of Integrated Breakover Diode", Proceedings of PCIM, Maui, 1996, pages 465–472, disclose realizing, in symmetrically blocking thyristors, a higher carrier lifetime in an amplifying gate structure situated in the central region of the thyristor than in the region below the cathode of the first main area of the body made of semiconductor material.

The invention is based on the object of providing a thyristor which can be loaded with a voltage surge within the recovery time without, in the process, the thyristor being destroyed by current splitting which usually occurs in the region of the body made of semiconductor material which lies below the cathode of the thyristor.

SUMMARY OF THE INVENTION

This solution provides a thyristor having the following construction: in a body made of differently doped semiconductor material which has an electrode serving as cathode and also an electrode serving as anode, there are formed

- a cathodal emitter of a first conduction type
- a cathodal base of a second conduction type,
- an anodal base of the first conduction type,
- an anodal emitter of the second conduction type and
- at least one driver stage for amplifying a control current fed into the cathodal base,
- the driver stage has a further emitter of the first conduction type, which is formed in the cathodal base and is isolated from the cathodal emitter, and also a metallization layer which makes contact both with the cathodal base and with the further emitter,
- a transistor gain factor $\alpha'_{npn}$ of the at least one driver stage, which factor is defined, below the metallization layer of said driver stage, by the further emitter, the cathodal base and the anodal base, is greater than a transistor gain factor $\alpha_{npn}$ of the thyristor, which factor is defined, below the cathode of the thyristor by the cathodal emitter, the cathodal base and the anodal base, and/or
- a transistor gain factor $\alpha'_{pnp}$ of the at least one driver stage, which factor is defined, below the metallization layer of said driver stage, by the cathodal base, the anodal base and the anodal emitter, is greater than a transistor gain factor $\alpha_{pnp}$ of the thyristor, which factor is defined, below the cathode of the thyristor, by the cathodal base, the anodal base and the anodal emitter, and/or
- anode short circuits connect the anodal base and the anode to one another and have a smaller electrical conductivity below the metallization layer of the at least one driver stage than below the cathode of the thyristor.

Accordingly, the thyristor according to the invention differs from the thyristor of the type mentioned in the introduction by virtue of the fact that the transistor gain factor $\alpha'_{npn}$ of the at least one driver stage is greater than the transistor gain factor $\alpha_{npn}$ of the thyristor and/or that the transistor gain factor $\alpha'_{pnp}$ of said driver stage is greater than the transistor gain factor $\alpha_{pnp}$ of the thyristor.

What is advantageously achieved by this solution is that triggering of the thyristor which is initiated by a voltage surge within the recovery time firstly takes place outside the region of the body made of semiconductor material which lies below the cathode of the thyristor, and as far as possible within a driver stage. The targeted displacement of the triggering from the region lying below the cathode into the driver stage has the consequence that the triggering front which follows the voltage surge can propagate very rapidly and, consequently, current splitting is avoided.

The invention is based on the insight that dimensioning the thyristor in such a way that the transistor gain factor $\alpha'_{npn}$ and/or $\alpha'_{pnp}$ of the at least one driver stage is greater, preferably significantly higher, than the transistor gain factor $\alpha_{npn}$ and/or $\alpha_{pnp}$ of the thyristor brings about greater flooding with free charge carriers and extinguishing of the current flow in this driver stage. Preferably, $\alpha'_{npn}$ is set to be greater than $\alpha_{npn}$ and also $\alpha'_{pnp}$ is set to be greater than $\alpha_{pnp}$.

As a rule, i.e. without such dimensioning of the transistor gain factors $\alpha'_{npn}$, $\alpha'_{pnp}$, $\alpha'_{npn}$ and $\alpha_{pnp}$, the triggering in the event of a voltage surge within the recovery time does not occur in the driver stage, in particular in the region lying below the metallization layer of this stage, because at this point in time no or few free charge carriers, which are known to promote the triggering operation, are present in the driver stage—in contrast to that region of the thyristor which lies below the cathode. The reason for this is that the driver stage turns off again significantly earlier than the thyristor below the cathode.

Preferably and advantageously, in the thyristor according to the invention, the anodal base has a stop zone of the first conduction type, which means that the thyristor is an asymmetrical thyristor.

In such an asymmetrical thyristor, it is advantageously possible to realize an increase in the transistor gain factors $\alpha'_{npn}$, $\alpha'_{pnp}$ of the at least one driver stage relative to the transistor gain factors $\alpha_{npn}$, $\alpha_{pnp}$ of the thyristor in the region lying below the cathode thereof in a simple manner by virtue of the stop zone being doped more weakly in the region lying below the metallization layer of said driver stage than in a region lying below the cathode of the thyristor.

In a preferred and advantageous refinement of this asymmetrical thyristor, the stop zone is doped more highly in the region lying below the metallization layer of the at least one driver stage than in a region lying below a location for feeding a control current into the cathodal base. One advantage of this refinement can be seen in the fact that light and/or breakover triggering protection of the thyristor is also provided in addition to the voltage surge loadability in the recovery time.

The invention is also based on the insight that as an alternative or in addition to the above dimensioning specification, the extinguishing of the current in a driver stage can be impeded by virtue of anode short circuits connecting the anodal base and the anode to one another and having a smaller electrical conductivity below the metallization layer of the at least one driver stage than below the cathode of the thyristor.

The application of anode short circuits is generally advantageous.

A smaller electrical conductivity of anode short circuits can be achieved, for example, by means of the anode short circuits being at a greater distance from one another and/or said short circuits having a smaller diameter.

Accordingly, in an advantageous and preferred embodiment of the thyristor according to the invention, the anode short circuits, below the metallization layer of the at least one driver stage, are at a greater distance from one another and/or have a smaller diameter than below the cathode of the thyristor.

In addition, it is advantageous to set the charge carrier lifetime in a region of the body made of semiconductor material which lies outside the cathode of the thyristor to be greater, preferably significantly longer, than in the region lying below the cathode. This can be realized for example by means of masked irradiation of the body with electrons or protons, the region lying outside the cathode being covered with a metal mask during the irradiation and the region lying below the cathode being open. In order to achieve a practical gradation of the carrier lifetime in the region lying outside the cathode and of the carrier lifetime in the region lying below the cathode, with the aim of satisfactory breakover voltages and recovery times, generally a second whole-area irradiation of the body should be effected beforehand and/or afterward.

An advantageous development of the invention is an arrangement comprising an asymmetrical thyristor according to the invention and a diode, the thyristor and the diode being electrically connected to one another. This arrangement creates a novel tandem thyristor which has the advantage that the asymmetrical thyristor has no space charge zone in the event of blocking loading in the reverse direction, so that in this case space-charge-governed depletion of free charge carriers, in particular of the free charge carriers with which the driver stage is flooded, is obviated, and, consequently, these free charge carriers are preserved for longer.

The invention advantageously makes it possible to realize an integrated recovery time protection which is effective under all operating conditions.

BRIEF DESCRIPTION OF THE DRAWING

The invention is explained in more detail by way of example in the description below with reference to the drawing.

The FIGURE shows an exemplary embodiment of the thyristor according to the invention in cross section.

DETAILED DESCRIPTION OF THE PREFERRED EMBODIMENTS

The thyristor which is illustrated in, cross section in the FIGURE and generally designated by 1 has a body 10 made of differently doped semiconductor material, for example silicon. The body 10 is in the form, for example, of a wafer having two main areas 11 and 12 that are remote from one another.

An electrode 13 serving as cathode of the thyristor 1 is formed on the main area 11 and an electrode 14 serving as anode of the thyristor 1 is formed on the main area 12.

The thyristor 1 is, for example, rotationally symmetrical with regard to an axis A perpendicular to the two main areas 11 and 12 of the body 10.

The cathodal emitter of the first conduction type is defined by an $n^+$-doped region 15 of the body 10, which region adjoins the main area 11 of said body 10.

The cathodal base of the second conduction type is defined by a p-doped region 16 of the body 10, which region adjoins the $n^+$-doped region 15 and, together with this region 15, forms an np junction 156.

The anodal base 17 of the first conduction type is defined by an $n^-$-doped region 171 and an $n^+$-doped region 172 of the body 10 which adjoin one another and of which the $n^-$-doped region 171 adjoins the p-doped region 16 of the cathodal base and, together with this region 16, forms a pn junction 167.

The anodal emitter of the second conduction type is defined by a $p^+$-doped region 18 of the body 10, which region, on the one hand, adjoins the $n^+$-doped region 172 of the anodal base 17 and, together with this region 172, forms an np junction 178 and, on the other hand, adjoins the main area 12 of the body 10.

One or more cathode short circuits 160 are formed in the cathodal emitter 15, each of which cathode short circuits connects the cathodal base 16 and the cathode 13 to one another. These cathodes short circuits 160 ensure that, even in the event of a large dU/dt loading of a few 1000 volts/μs, the thyristor 1 does not already trigger in an uncontrolled manner before the static breakover voltage is reached.

In order to suppress the influence of a leakage current on the transistor gain factor $\alpha_{pnp}$ of the thyristor 1, which factor is defined by the cathodal base 16, the anodal base 17 and the anodal emitter 18, with low leakage current densities, one or more anode short circuits 174 are formed in the anodal emitter 18, each of which anode short circuits connects the anodal base 17 and the anode 14 to one another.

The body 10 has at least one driver stage 20 for amplifying a control current I fed into the cathodal base 16 through the main area 11.

The driver stage 20 has a further emitter 21 in the form of a, for example, $n^+$-doped region adjoining the main area 11 of the body 10, which further emitter is formed in the p-doped region 16 of the cathodal base and is spatially separate from the cathodal emitter 15 and the cathode 13 base of the thyristor 1, and also a metallization layer 22 which is formed on said main area 11 of the body 10 and is spatially separate from the cathodal emitter 15 and the cathode 13 base of the thyristor 1 and makes contact both with the $n^+$-doped further emitter 21 and with the p-doped cathodal base 16 which likewise adjoins the main area 11 of the body 10 laterally beside the further emitter 21.

The $n^+$-doped further emitter 21 of the driver stage forms an np junction 162 together with the p-doped cathodal base 16 of the thyristor.

Instead of only one driver stage 21, one or more additional driver stages (not illustrated) may be present, each of which has a respective further emitter adjoining the main area 11 of the body 190 and a respective metallization layer which is formed on said main area 11 and makes contact both with said further emitter and with the cathodal base 16. The further emitter and the metallization layer of each additional driver stage are arranged such that they are spatially separate from the emitter and the metallization layer of the driver stage 20 and any other additional driver stage and also from the cathodal emitter 15 and the cathode 13 of the thyristor 1.

The control current I fed into the cathodal base 16 is generated at a location 30 of the main area 11 of the body 10 which is situated beside the $n^+$-doped further emitter 21 of the driver stage 20 and at which the cathodal base 16 adjoins the main area 11 of the body 10 in a manner free from the metallization layer 22 of the driver stage 20 and the cathode 13 of the thyristor 1.

The location 30 for feeding in the control current I is, for example, a central partial region—surrounding the axis A—of the main area 11 of the body 10.

The control current I can be generated with the aid of a light-sensitive structure (not illustrated), formed on or below. The location 30, by radiating optical radiation 31 into the structure and/or a triggering contact (likewise not illustrated) formed on said location 30 (in this respect, see, for example, WO 98/34282).

The driver stage 20 is arranged radially with respect to the axis A between the location 30 and the cathodal emitter 15 and the cathode 13 of the thyristor 1.

The thyristor 1 and the driver stage 20 are designed and dimensioned according to the invention in such a way that the transistor gain factor $\alpha'_{npn}$ of the driver stage 20, which factor is defined, below-the metallization layer 22 of said driver stage 20, by the further emitter 21, the cathodal base 16 and the anodal base 17, is greater than the transistor gain factor $\alpha_{npn}$ of the thyristor 1, which factor is defined, below the cathode 13 of the thyristor 1, by the cathodal emitter 15, the cathodal base 16 and the anodal base 17, and/or the transistor gain factor $\alpha'_{pnp}$ of the at least one driver stage 20, which factor is defined, below the metallization layer 22 of said driver stage 20, by the cathodal base 16, the anodal base 17 and the anodal emitter 18, is greater than the transistor gain factor $\alpha_{pnp}$ of the thyristor 1, which factor is defined, below the cathode 13 of the thyristor 1, by the cathodal base 16, the anodal base 17 and the anodal emitter 18.

Preferably, $\alpha'_{npn} > \alpha_{npn}$ and at the same time $\alpha'_{pnp} > \alpha_{pnp}$ are chosen.

If one or more additional driver stages are present besides the driver stage 20, then the above specification can also be realized for one or more or even any additional driver stage, even though it suffices for said specification to be realized only for a single one of the plurality of driver stages, for the driver stage 20 in the present case.

The exemplary thyristor 1 is an asymmetrical thyristor in which the anodal base 17 has a stop zone of the first conduction type n which is formed by the n⁺-doped region 172 of said base 17.

In such an asymmetrical thyristor 1, the above dimensioning specification with regard to the transistor gain factors can be realized in a simple manner by virtue of the stop zone 172 being doped more weakly in a region 220 lying below the metallization layer 22 of the at least one driver stage 20 than in a region 130 lying below the cathode 13 of the thyristor 1.

The more weakly doped region 220 of the stop zone 172 preferably extends right under the location 30 for feeding a control current I into the cathodal base 16.

The more weakly doped region 220 of the stop zone 172 which also extends under the location 30 can have the same weak doping below said location 30 as outside said location 30.

The stop zone 172 can also be doped more highly in the region 220 lying below the metallization layer 22 of the at least one driver stage 20 than in the region 300 lying below the location 30, which region is demarcated from the rest of the more weakly doped region 220 of the, stop zone 172 by the dashed line 301 parallel to the axis A.

The anode short circuits 174 have a smaller electrical conductivity below the metallization layer 22 of the driver stage 20 than below the cathode 13 of the thyristor 1. This is realized in a simple manner by virtue of a distance d1 between the anode short circuits 174 being larger below the metallization layer 22 of the driver stage 20 than below the cathode 13 of the thyristor 1 and/or a diameter d2 of the anode short circuits 174 being smaller below the metallization layer 22 of the driver stage 20 than below the cathode 13 of the thyristor 1.

If one or more additional driver stages are present, this measure can be realized as an alternative to the driver stage 20 or in addition to the latter in this case of one, a plurality or all of the additional driver stages.

If, as illustrated in the FIGURE, a diode 4 is connected to the anode 14 of the thyristor 1, then an asymmetrical tandem thyristor is realized.

What is claimed is:

1. A thyristor made of a semiconductor material, said thyristor comprising:

a first emitter region of a first conductivity type;

a first contact region contacting said first emitter region;

a first base region of a second conductivity type disposed on said first emitter region opposite the first contact region;

a second base region of the first conductivity type disposed on said first base region;

a second emitter region of the second conductivity type disposed on said second base region;

a second contact region contacting said second emitter region opposite said second base region;

at least one driver stage having a third emitter region of the first conductivity type formed in said second base region and isolated from said first emitter region, said driver stage capable of amplifying a control current fed into the first base region; and an electrically conducting layer electrically connecting the first base region with the third emitter region;

wherein the thyristor includes at least one of the following features:

said third emitter region and said first base region located beneath said layer of said driver stage together with said second base region form a transistor having a gain factor ($\alpha'$) that is greater than a gain factor ($\alpha$) of a transistor formed beneath the first electrode of the thyristor by the first emitter region, the first base region and the second base region, and said first base region, said first base region and said second base region located beneath said layer of said driver stage form a transistor having a gain factor ($\alpha'$) that is greater than a gain factor ($\alpha$) of a transistor formed beneath the first electrode of the thyristor by the first base region, the second base region and the second emitter region, and short circuits are formed in the second base, said short circuits connecting the second base and the second contact region to one another, and wherein an electrical conductivity of the short circuits formed below the electrically conducting layer is smaller than an electrical conductivity of the short circuits formed beneath the first contact region.

2. The thyristor of claim 1, the second base further including a stop zone of the first conductivity type.

3. The thyristor of claim 2, wherein a doping level of the stop zone in a region located beneath the electrically conducting layer of the at least one driver stage is smaller than a doping level in a region located beneath the first contact region.

4. the thyristor of claim 2, wherein a doping level of the stop zone in a region located beneath the electrically conducting layer of the at least one driver stage is greater than in a region located beneath a location adapted to supply the control current to the first base region.

5. The thyristor of claim 1, wherein the short circuits formed beneath the electrically conducting layer of the driver stage are at a greater distance from one another than the short circuits formed beneath the first contact region.

6. The thyristor of claim 1, further comprising a diode electrically connected to the second contact region.

7. The thyristor of claim 1, wherein the short circuits formed beneath the electrically conducting layer of the driver stage have a smaller diameter than the short circuits formed beneath the first contact region.

8. The thyristor of claim 1, wherein the first conductivity type is n-type and the second conductivity type is p-type.

9. The thyristor of claim 1, wherein the first conductivity type is p-type and the second conductivity type is n-type.

* * * * *